(12) United States Patent
Singh et al.

(10) Patent No.: US 11,211,448 B2
(45) Date of Patent: Dec. 28, 2021

(54) CAPACITOR STRUCTURE WITH MIM LAYER OVER METAL PILLARS

(71) Applicant: GLOBALFOUNDRIES U.S. INC., Santa Clara, CA (US)

(72) Inventors: Sunil K. Singh, Mechanicville, NY (US); Eswar Ramanathan, Mechanicville, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 124 days.

(21) Appl. No.: 16/704,180

(22) Filed: Dec. 5, 2019

(65) Prior Publication Data

US 2021/0175323 A1 Jun. 10, 2021

(51) Int. Cl.
*H01L 23/522* (2006.01)
*H01L 49/02* (2006.01)
*H01L 21/768* (2006.01)

(52) U.S. Cl.
CPC ........ *H01L 28/91* (2013.01); *H01L 21/76885* (2013.01); *H01L 23/5223* (2013.01); *H01L 28/55* (2013.01)

(58) Field of Classification Search
CPC ............... H01L 28/91; H01L 21/76885; H01L 23/5223; H01L 28/55
See application file for complete search history.

(56) References Cited

U.S. PATENT DOCUMENTS

| | | |
|---|---|---|
| 2005/0275005 A1 | 12/2005 | Choi et al. |
| 2012/0304742 A1 | 12/2012 | Cummins |
| 2013/0181326 A1 | 7/2013 | Cheng et al. |
| 2014/0225222 A1* | 8/2014 | Yu ........................ H01L 24/97 257/532 |
| 2016/0000344 A1 | 1/2016 | Cao |
| 2019/0051659 A1* | 2/2019 | Xie ................... H01L 27/11521 |

* cited by examiner

*Primary Examiner* — Thomas L Dickey

(74) *Attorney, Agent, or Firm* — Anthony Canale; Hoffman Warnick LLC

(57) ABSTRACT

A capacitor structure for an integrated circuit (IC) is provided. The capacitor structure includes a plurality of spaced metal pillars with each metal pillar positioned on a corresponding underlying metal wire of an underlying metal layer. A metal-insulator-metal layer is positioned over and between the metal pillars. At least one contact is operatively coupled to a first metal pillar of the plurality of metal pillars. The metal-insulator-metal layer creates a MIM capacitor that undulates over the metal pillars, creating a higher density capacitance compared to conventional planar MIM capacitors. The metal pillars extend into the metal-insulator-metal layer, which reduces contact resistance. The capacitor structure can be integrated into an IC with no major integration issues. A related method is also provided.

20 Claims, 6 Drawing Sheets

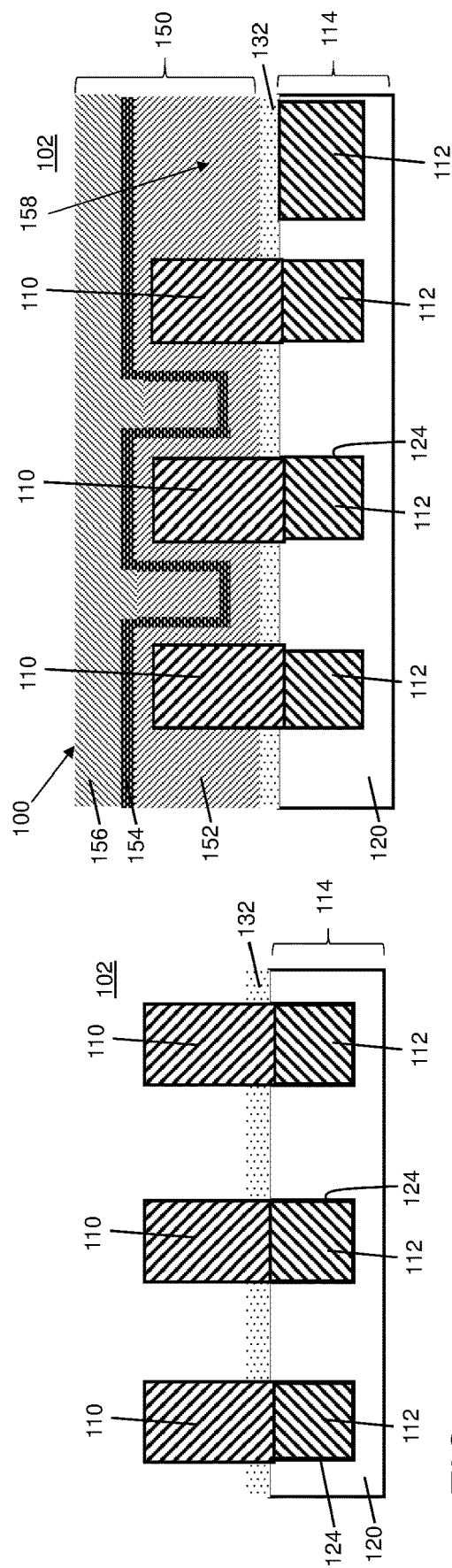

CAPACITOR STRUCTURE WITH MIM LAYER OVER METAL PILLARS

BACKGROUND

The present disclosure relates to integrated circuit (IC) fabrication, and more specifically, to a capacitor structure with metal pillars over which a metal-insulator-metal (MIM) layer undulates to create a higher density MIM capacitor. A related method is also provided.

Capacitors are used widely in integrated circuits, such as accelerated processing units (APU) or graphics processing units (GPU), to store a charge. Capacitors can take a variety of forms such as vertical natural capacitors (VNCAP) and metal-oxide-metal (MOM) capacitors. Current capacitors are also formed from a combination of metal-insulator-metal (MIM) layers. MIM layers are typically arranged in a planar fashion in the IC, and electrical contacts are made to each of the metal layers to form the capacitor. Planar MIM capacitors use a relatively large area due to their planar layout. Consequently, the density of planar MIM capacitors and the capacitance per unit semiconductor area for planar MIM capacitors are not competitive. One approach to improve capacitance uses undulating MIM layers with contacts to ends of the layer, but this provides poor contact resistance. Finger-based MIM capacitors employ complex finger elements, but are more difficult to manufacture.

SUMMARY

A first aspect of the disclosure is directed to a capacitor structure for an integrated circuit (IC), the capacitor structure comprising: a plurality of spaced metal pillars, each metal pillar positioned on a corresponding underlying metal wire of an underlying metal layer; and a metal-insulator-metal layer over and between the plurality of spaced metal pillars.

A second aspect of the disclosure includes a capacitor structure for an integrated circuit (IC), the capacitor structure comprising: a first metal pillar over a first underlying metal wire of an underlying metal layer; a second metal pillar over a second underlying metal wire of the underlying metal layer, the first metal pillar and the first underlying metal wire spaced from the second metal pillar and the second underlying metal wire; and a metal-insulator-metal layer over and between the first metal pillar and the second pillar, wherein the metal-insulator-metal layer includes a first capacitor metal layer over and between the first and second metal pillars, an insulator layer over the first capacitor metal layer, a second capacitor metal layer over the insulator layer; and at least one contact operatively coupled to the second capacitor metal layer.

A third aspect of the disclosure related to a method of forming a metal-insulator-metal (MIM) capacitor for an integrated circuit, the method comprising: forming a metal pillar over each of a selected plurality of spaced underlying metal wires of an underlying metal layer; and forming a metal-insulator-metal layer over and between the metal pillars to form the MIM capacitor.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 3 shows a cross-sectional view of removing the material layer to expose upper portions of the metal pillars over the metal wires, according to embodiments of the disclosure.

FIG. 4 shows a cross-sectional view of forming a metal-insulator-metal (MIM) layer over the metal pillars to form a capacitor structure, according to embodiments of the disclosure.

Figure 1:
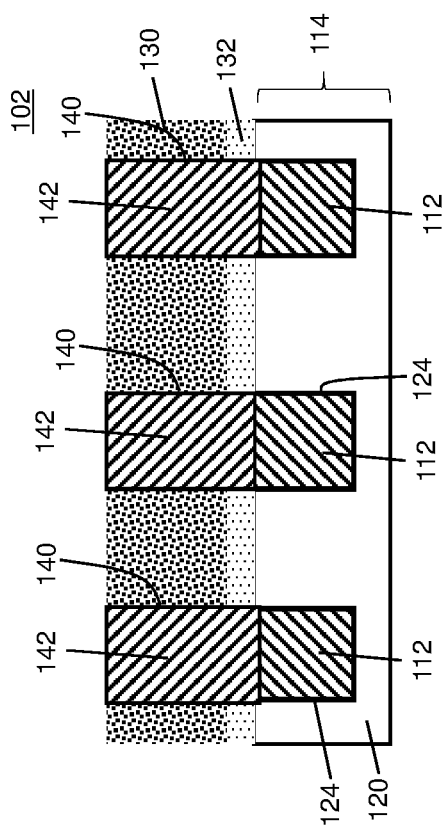
FIG. 1 shows a cross-sectional view of forming cavities in a material layer over metal wires, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a capacitor structure for an integrated circuit (IC). The capacitor structure includes a plurality of spaced metal pillars with each metal pillar positioned on a corresponding underlying metal wire of an underlying metal layer. A metal-insulator-metal (MIM) layer is positioned over and between the metal pillars. At least one contact may be operatively coupled to an upper capacitor metal layer. The MIM layer creates a MIM capacitor that undulates over the metal pillars, creating a higher density capacitance compared to conventional planar MIM capacitors. The metal pillars extend into the MIM layer, which reduces contact resistance. The capacitor structure can be integrated into an IC with no major integration issues. A related method is also provided.

Referring to FIGS. 1-7, embodiments of a method of forming a capacitor structure 100 (FIG. 7), namely a MIM capacitor, for an integrated circuit (IC) 102, are illustrated.

Figure 2:
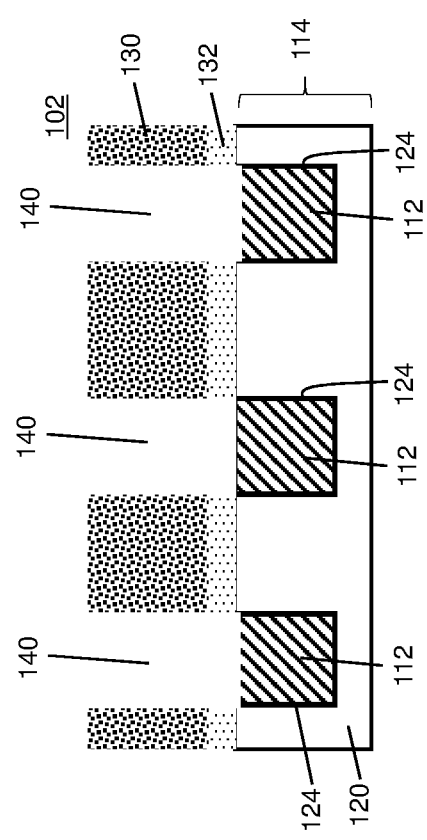
FIG. 2 shows a cross-sectional view of filling the cavities with a metal to form metal pillars, according to embodiments of the disclosure.

FIGS. 1-3 show cross-sectional views of forming a metal pillar 110 (FIG. 3) over each of a selected plurality of spaced underlying metal wires 112 of an underlying metal layer 114. Underlying metal layer 114 may include any metal layer in IC 102. In one example, underlying metal layer 114 may be a first metal layer, i.e., over a device layer (not shown). However, underlying metal layer 114 may be any back end of line (BEOL) layer. As understood, a BEOL layer is any layer formed on the semiconductor wafer (not shown) in the course of device manufacturing following first metallization. Underlying metal layer 114 may include any interlayer dielectric (ILD) 120. ILD 120 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Metal wires 112 in underlying metal layer 114 may be formed in any now known or later developed fashion. In one non-limiting example, metal wires 112 may be formed by lithographically defining openings 124 in ILD 120, then depositing metal to fill resulting trenches, and then removing excess metal, e.g., by means of chemical-mechanical polishing (planarization). Openings 124 may be etched in ILD 120, i.e., using a mask (not shown). Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Openings 124 for metal wires 112 may be etched, for example, using RIE.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Here, the metal may be deposited using, for example, ALD. A refractory metal liner (not shown) of, for example, ruthenium (Ru), tantalum (Ta), titanium (Ti), tungsten (W), iridium (Jr), rhodium (Rh), platinum (Pt), etc., or mixtures of thereof, may be deposited prior to metal deposition. Metal wires 112 may include any conductor employed in IC wiring, for example, copper. While three metal wires 112 are shown in the drawing, two or more than three may be employed. The number of metal wires 112 may be chosen to create a certain size capacitor structure, as will be described. As will be described, metal wires (not shown in FIG. 1) may also be formed for underlying metal layer 114 in a non-MIM region 158 (FIGS. 4-7), e.g., for logic, adjacent to the MIM capacitor.

FIG. 1 also shows forming a material layer 130 over an etch stop layer (ESL) 132 over selected plurality of spaced underlying metal wires 112. That is, material layer 130 and etch stop layer (ESL) 132 are formed over underlying metal layer 114. ESL 132 may include any material typically used to stop etching such as but not limited to silicon nitride (e.g., n-Blok), and may be formed by any appropriate deposition technique, e.g., CVD. Material layer 130 is formed over ESL 132, e.g., by CVD. Material layer 130 may include any sacrificial material capable of defining cavities for metal pillar 110 (FIG. 3) formation. For example, material layer 130 may include any ILD material listed herein. FIG. 1 also shows patterning a cavity 140 in material layer 130 and ESL 132 over each of selected plurality of spaced underlying metal wires 112. Cavities 140 may be patterned by forming a mask (not shown), patterning the mask and etching to remove material layer 130 and ESL 132 over underlying metal wires 112. The etching may include, for example, a RIE. While shown with each cavity 140 aligned over metal wires 112, some misalignment may be allowed. Further, while a cavity 140 is shown over each metal wire 112, a cavity 140 is not necessarily required over each metal wire, e.g., where more than two metal wires 112 are provided between outermost metal wires. The number of cavities 140 (and hence the number of metal pillars 110 formed therein) may be defined to customize the number of undulations in an eventually formed MIM layer, and hence, used to control the capacitance of capacitor structure 100 (FIG. 7), i.e., by controlling its length created in the undulations. In one embodiment, at least three metal wires 112 and at least three metal pillars 110 are provided.

FIG. 2 shows a cross-sectional view of filling each cavity 140 with a metal 142. Metal 142 may be deposited, e.g., by ALD, followed by a planarization step to remove excess metal. Metal 142 may be the same as or different than metal wires 112. In one embodiment, metal 142 may include copper (Cu). In other embodiments, metal 142 may include but is not limited to: titanium, titanium nitride, ruthenium, tungsten, cobalt or any other conductive metal. FIG. 3 shows a cross-sectional view of removing material layer 130 to leave a metal pillar 110 over each of selected plurality of spaced underlying metal wires 112. An upper portion of metal pillars 110 are exposed by this process. Material layer 130 may be removed using any appropriate etching process selective to metal 142 (FIG. 2), e.g., a RIE. Metal pillars 110 are spaced apart per the spacing of underlying metal wires 112.

Figure 5:
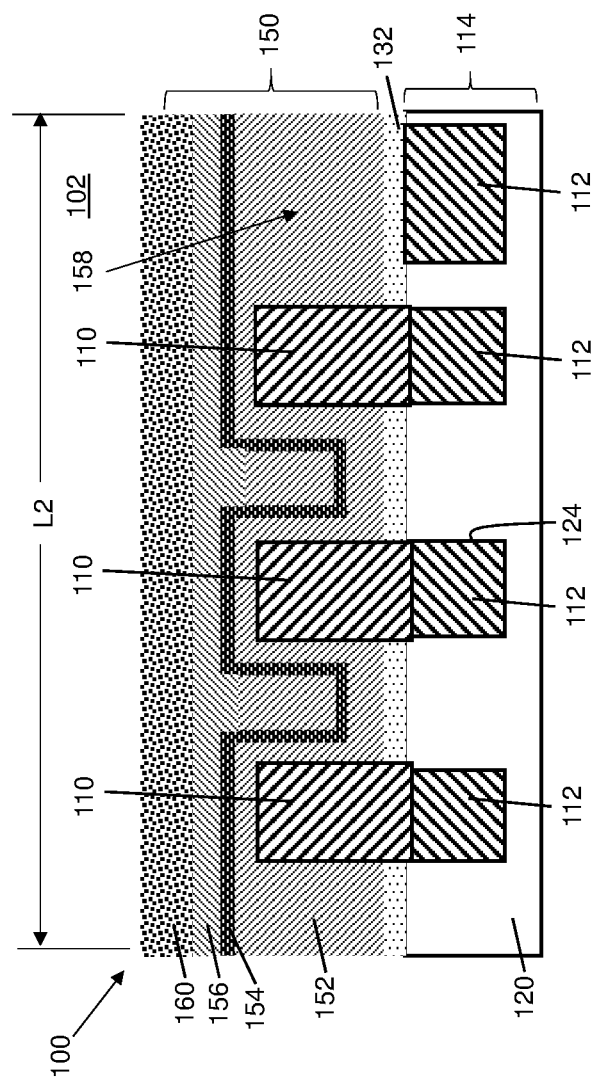
FIG. 5 shows a cross-sectional view of forming an interlayer dielectric over the capacitor structure, according to embodiments of the disclosure.
Figure 6:
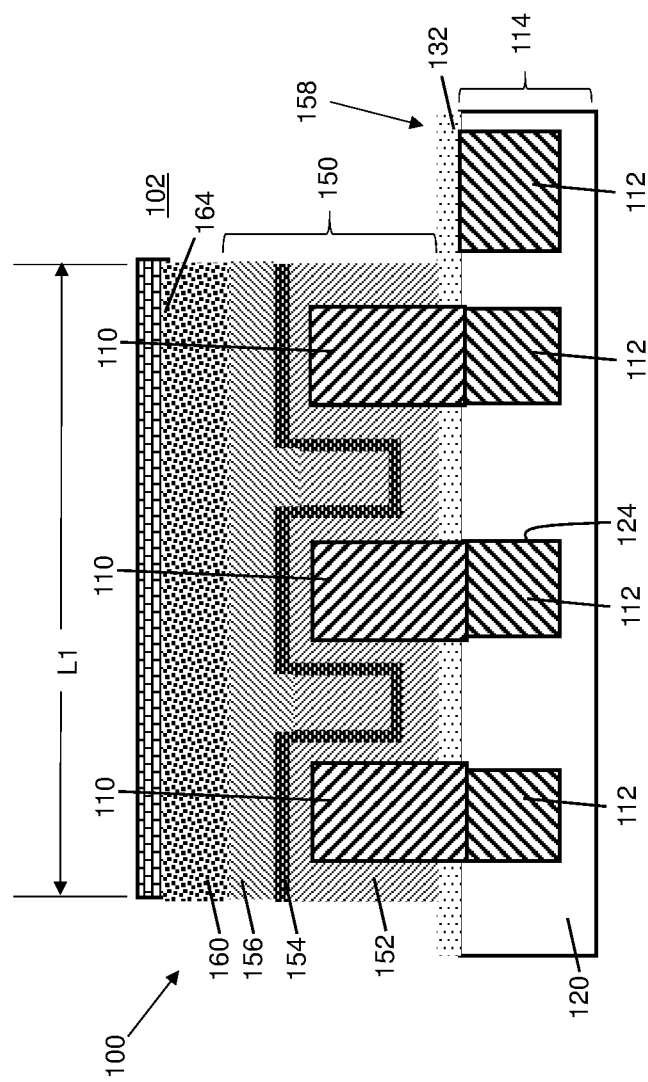
FIG. 6 shows a cross-sectional view of patterning the capacitor structure, according to embodiments of the disclosure.
Figure 7:
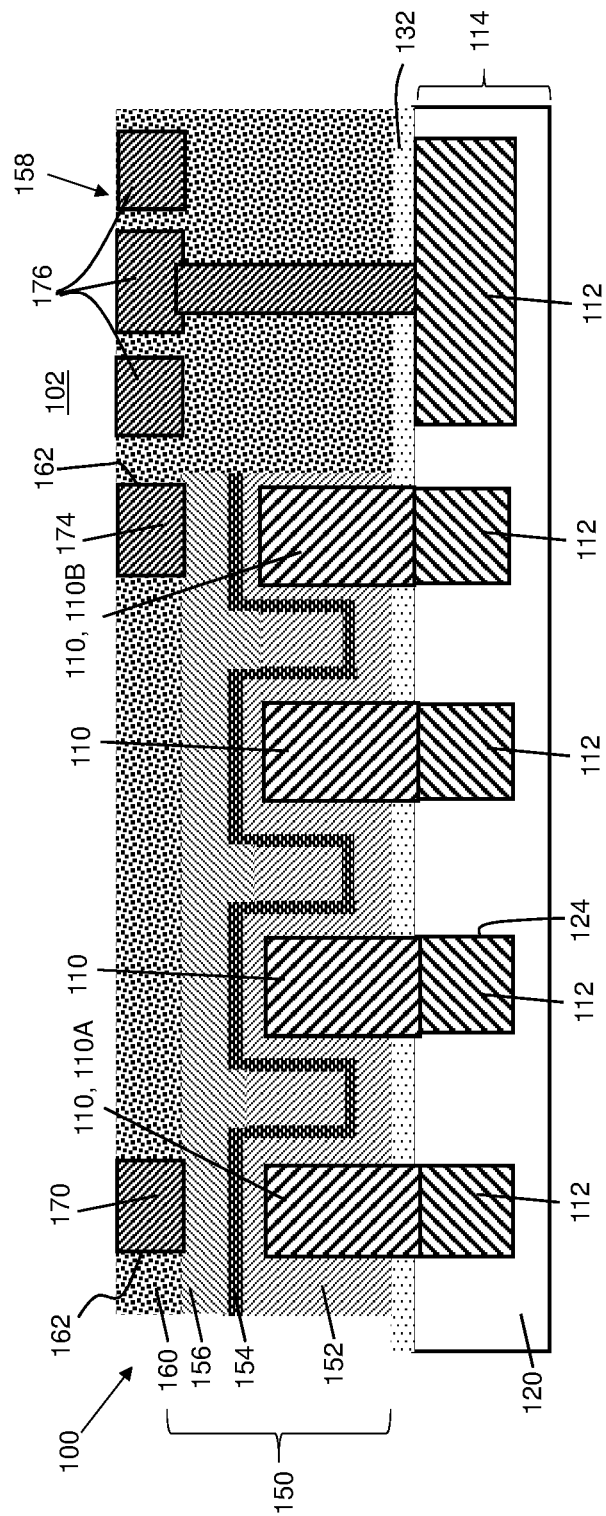
FIG. 7 shows a cross-sectional view of forming contacts to the capacitor structure, according to embodiments of the disclosure.

FIGS. 4-7 show cross-sectional views of forming a metal-insulator-metal (MIM) layer 150 over and between spaced metal pillars 110 to form capacitor structure 100 (FIG. 7). Forming MIM layer 150 over and between spaced metal pillars 110 includes forming a first capacitor metal layer 152 over and between metal pillars 110, forming an insulator layer 154 over first capacitor metal layer 152, and forming a second capacitor metal layer 156 over insulator layer 154.

Each layer 152, 154, 156 may be formed by any appropriate deposition for the materials used, e.g., ALD. As illustrated in FIG. 4, each metal pillar 110 is contacted on three sides by first capacitor metal layer 152, which improves a contact resistance of metal wire 112 to first capacitor metal layer 152 that provides a first electrode of capacitor structure 100 (FIG. 7). Capacitor metal layers 152, 156 may include any now known or later developed capacitor electrode material including but not limited to: titanium nitride (TiN), ruthenium (Ru), tantalum nitride (TaN), or any other conductive materials. Insulator layer 154 may include any now known or later developed high dielectric constant (high-K) material appropriate for a MIM capacitor. In one embodiment, insulator layer 154 may include but is not limited to: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero.

As illustrated in FIG. 4, spacing between metal pillars 110 may be such that first capacitor metal layer 152 and insulator layer 154 undulate over metal pillars 110. That is, first capacitor metal layer 152 and insulator layer 154 extend in valleys between metal pillars 110 and peaks over metal pillars 110, in a somewhat sinusoidal fashion. In this manner, the length of capacitor structure 100 (FIG. 7) can be increased without increasing geographic area within IC 102. As shown in the example in FIG. 4, second capacitor metal layer 156 may fill any remaining space between metal pillars 110 (e.g., left between insulator layer 154 as it passes over metal pillars 110). Second capacitor metal layer 156 also extends over metal pillars 110. Any excess second capacitor metal layer 156 may be removed, e.g., by planarizing. MIM layer 150 forms capacitor structure 100. FIGS. 4-6 also show an additional metal wire 112 (right side) in underlying metal layer 114 in non-MIM (e.g., logic) region 158 that is not covered by a metal pillar 110.

As shown in the cross-sectional view of FIG. 5, embodiments of the method may further include forming an ILD 160 over capacitor structure 100. ILD 160 may include any now known or later developed ILD such as listed herein relative to ILD 120. Any necessary planarization may be carried out at this stage.

FIG. 6 shows a cross-sectional view of patterning capacitor structure 100 to a selected dimension(s), e.g., trimming a length across page and/or depth into and out of page. Capacitor structure 100 may be patterned, for example, by patterning a mask 164 over capacitor structure 100 and etching to remove any un-desired MIM layer 150. In the example shown, a length L1 is shorter in FIG. 6 than a length L2 in FIG. 5. It is understood that a depth of capacitor structure 100 into and out of the page could be similarly customized. In this manner, dimension(s) of capacitor structure 100 can be customized to deliver the desired capacitance. Any MIM layer 150 that may be present in non-MIM region 158 of IC 102 can also be removed as part of the patterning of capacitor structure 100.

FIG. 7 shows a cross-sectional view of forming at least one contact 170, 174 operatively coupled to second capacitor metal layer 156. While one contact may be employed, at least two spaced contacts 170, 174 operatively coupled to second capacitor metal layer 156 are advantageous to reduce contact resistance. Note, the embodiment shown in FIG. 7 also includes more than three metal pillar 110 and metal wire 112 pairs with MIM layer 150 thereover, and is longer than the FIG. 6 embodiment. The contact forming process may include replacing any ILD 160 removed during the patterning of FIG. 6. ILD 160 may also be replaced over non-MIM region 158, which is shown larger in FIG. 7 than in FIGS. 4-6 for clarity. Contact(s) 170, 174 may be formed using any now known or later developed process. In one non-limiting example, contact(s) 170, 174 may be formed by lithographically defining openings 162 in ILD 160, then depositing metal to fill resulting trenches, and then removing excess metal, e.g., by means of chemical-mechanical polishing (planarization). Openings 162 may be etched in ILD 160, e.g., using RIE. Here, the contact metal may be deposited using, for example, ALD. A refractory metal liner (not shown) of, for example, ruthenium (Ru), tantalum (Ta), titanium (Ti), tungsten (W), iridium (Jr), rhodium (Rh), platinum (Pt), etc., or mixtures of thereof, may be deposited prior to metal deposition. Contact(s) 170, 174 may include any contact conductor employed in IC wiring, for example, copper. In one embodiment, contact 170 is aligned over a first metal pillar 110A, and contact 174 is aligned over second metal pillar 110B, but this is not necessary in all instances. A number of contacts 170, 174 may be customized to reduce contact resistance. As illustrated, metal wires, and/or contacts 176 for non-MIM region 158 may be formed with contact(s) 170, 174.

Figure 8:
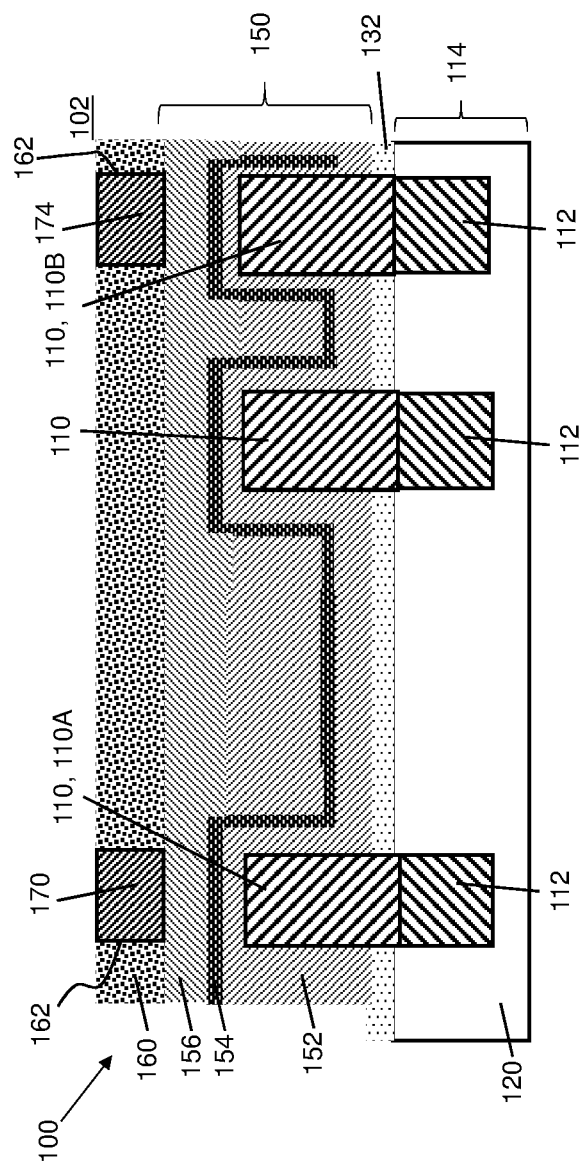
FIG. 8 shows a cross-sectional view of a capacitor structure in which the spacing between the metal pillar is non-uniform, according to another embodiment of the disclosure.

FIG. 8 shows a cross-sectional view of another embodiment similar to FIG. 7 but in which the spacing between metal pillar 110 and metal wire 112 pairs is non-uniform. As illustrated, MIM layer 150 thus may have non-uniform length valleys and/or non-uniform length peaks.

FIGS. 7 and 8 also show cross-sectional views of capacitor structure 100 for IC 102, according to embodiments of the disclosure. Capacitor structure 100 may include a plurality of spaced metal pillars 110 with each metal pillar 110 positioned on a corresponding underlying metal wire 112 of underlying metal layer 114. Metal wires 112 may include copper. ESL 132 may be adjacent a lower end of plurality of metal pillars 110, i.e., over underlying metal layer 114. Capacitor structure 100 also includes MIM layer 150 over and between plurality of spaced metal pillars 110. MIM layer 150 includes first capacitor metal layer 152 over and between plurality of spaced metal pillars 110, insulator layer 154 over first capacitor metal layer 152, and second capacitor metal layer 156 over insulator layer 154. The materials for capacitor metal layers 152, 156 and insulator layer 154 may be as previously described. As illustrated in FIG. 7, first capacitor metal layer 152 and insulator layer 154 undulate over spaced metal pillars 110. Again, first capacitor metal layer 152 and insulator layer 154 extend in valleys between metal pillars 110 and peaks over metal pillars 110, in a somewhat sinusoidal fashion. As shown in the example in FIG. 7, second capacitor metal layer 156 may fill any remaining space between metal pillars 110, e.g., left between insulator layer 154 as it passes over metal pillars 110. Second capacitor metal layer 156 extends over metal pillars 110. MIM layer 150 thus forms capacitor structure 100, i.e., a MIM capacitor. One or more metal pillars 110 may be positioned between the outermost metal pillars 110A, 110B (FIG. 7), allowing customization of the length and thus capacitance value of MIM layer 150 and capacitor structure 100. Capacitor structure 200 may also include at least one contact 170, 174 operatively coupled to second capacitor metal layer 156, i.e., a second electrode of capacitor structure 100.

Embodiments of the disclosure provide capacitor structure 100 that undulates over metal pillars 110, creating a higher density capacitance compared to conventional planar MIM capacitors. Metal pillars 110 extend into MIM layer 150 with MIM layer on three sides of each pillar, which reduces contact resistance. As is apparent from the description, capacitor structure 100 can be integrated into IC 102 with no major integration issues. Capacitor structure 100 is also compatible with decreasing dimensions of the latest technology nodes, e.g., 7 nanometers and beyond.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A capacitor structure for an integrated circuit (IC), the capacitor structure comprising:
    a plurality of spaced metal pillars, each metal pillar positioned on a corresponding underlying metal wire of an underlying metal layer; and
    a metal-insulator-metal layer over and along a side of the plurality of spaced metal pillars.

2. The capacitor structure of claim 1, wherein the metal-insulator-metal layer includes a first capacitor metal layer over and along the side of the plurality of spaced metal pillars, an insulator layer over the first capacitor metal layer, and a second capacitor metal layer over the insulator layer.

3. The capacitor structure of claim 2, further comprising at least one contact operatively coupled to the second capacitor metal layer.

4. The capacitor structure of claim 3, wherein the at least one contact is aligned over a first metal pillar of the plurality of spaced metal pillars.

5. The capacitor structure of claim 2, wherein the first capacitor metal layer and the second capacitor metal layer include a metal selected from the group comprising: titanium nitride (TiN), ruthenium (Ru), and tantalum nitride (TaN);
    wherein the insulator layer includes a high dielectric constant (high-K) material selected from the group comprising: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero; and
    wherein each of the underlying metal wires includes copper (Cu).

6. The capacitor structure of claim 2, wherein the first capacitor metal layer and the insulator layer undulate over the plurality of spaced metal pillars, and the second capacitor metal layer fills any remaining space between the plurality of spaced metal pillars and extends over the plurality of spaced metal pillars.

7. The capacitor structure of claim 2, wherein each metal pillar of the plurality of spaced metal pillars is contacted on three sides by the first capacitor metal layer.

8. The capacitor structure of claim 2, wherein the plurality of spaced metal pillars includes at least three metal pillars.

9. A capacitor structure for an integrated circuit (IC), the capacitor structure comprising:
    a first metal pillar over a first underlying metal wire of an underlying metal layer;
    a second metal pillar over a second underlying metal wire of the underlying metal layer, the first metal pillar and the first underlying metal wire spaced from the second metal pillar and the second underlying metal wire; and
    a metal-insulator-metal layer over and along a side of the first metal pillar and over and along a side of the second pillar, wherein the metal-insulator-metal layer includes a first capacitor metal layer over and along the side of the first and second metal pillars, an insulator layer over the first capacitor metal layer, a second capacitor metal layer over the insulator layer; and
    at least one contact operatively coupled to the second capacitor metal layer.

10. The capacitor structure of claim 9, wherein the at least one contact is aligned over a respective metal pillar.

11. The capacitor structure of claim 9, wherein the first capacitor metal layer and the second capacitor metal layer include a metal selected from the group comprising: titanium nitride (TiN), ruthenium (Ru), and tantalum nitride (TaN);
   wherein the insulator layer includes a high dielectric constant (high-K) material selected from the group comprising: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero; and
   wherein the first and second underlying metal wires include copper (Cu).

12. The capacitor structure of claim 9, wherein the first capacitor metal layer and the insulator layer undulates over the first and second metal pillars, and the second capacitor metal layer fills any remaining space between the first and second metal pillars and extends over the first and second metal pillars.

13. The capacitor structure of claim 9, wherein each metal pillar is contacted on three sides by the first capacitor metal layer.

14. The capacitor structure of claim 9, further comprising at least one third metal pillar over a corresponding third underlying metal wire of the underlying metal layer, each of the at least one third metal pillar and corresponding third underlying metal wire spaced from and between the first metal pillar and the first underlying metal wire and the second metal pillar and the second underlying metal wire.

15. A method of forming a metal-insulator-metal (MIM) capacitor for an integrated circuit, the method comprising:
   forming a metal pillar over each of a selected plurality of spaced underlying metal wires of an underlying metal layer; and
   forming a metal-insulator-metal layer over and along a side of the metal pillars to form the MIM capacitor.

16. The method of claim 15, wherein forming the metal pillars over each of the selected plurality of spaced underlying metal wires includes:
   forming a material layer over an etch stop layer (ESL) over the selected plurality of spaced underlying metal wires;
   patterning a cavity in the material layer and the ESL over each of the selected plurality of spaced underlying metal wires;
   filling each cavity with a metal; and
   removing the material layer to leave the metal pillar over each of the selected plurality of spaced underlying metal wires.

17. The method of claim 15, wherein forming the metal-insulator-metal layer over and along the side of the metal pillars includes:
   forming a first capacitor metal layer over and along the side of the metal pillars;
   forming an insulator layer over the first capacitor metal layer; and
   forming a second capacitor metal layer over the insulator layer,
   wherein the first capacitor metal layer and the insulator layer undulate over the metal pillars, and the second capacitor metal layer fills any remaining space between the metal pillars and extends over the metal pillars.

18. The method of claim 17, wherein the first capacitor metal layer and the second capacitor metal layer include a metal selected from the group comprising: titanium nitride (TiN), ruthenium (Ru), and tantalum nitride (TaN);
   wherein the insulator layer includes a high dielectric constant (high-K) material selected from the group comprising: tantalum oxide ($Ta_2O_5$), barium titanium oxide ($BaTiO_3$), hafnium oxide ($HfO_2$), zirconium oxide ($ZrO_2$), aluminum oxide ($Al_2O_3$), hafnium silicate oxide (HfSixOy) or hafnium silicon oxynitride (HfSixOyNz), where x, y, and z represent relative proportions, each greater than or equal to zero and x+y+z=1; and
   wherein each of the selected plurality of spaced underlying metal wires includes copper (Cu).

19. The method of claim 17, further comprising forming at least one contact landing on an upper surface of the second capacitor metal layer.

20. The method of claim 15, further comprising:
   forming an interlayer dielectric (ILD) over the MIM capacitor; and
   patterning the MIM capacitor to a selected dimension.

* * * * *